(12) United States Patent
Watanabe et al.

(10) Patent No.: US 11,251,145 B2
(45) Date of Patent: Feb. 15, 2022

(54) SEMICONDUCTOR SUBSTRATE AND MANUFACTURING METHOD THEREFOR

(71) Applicant: JX NIPPON MINING & METALS CORPORATION, Tokyo (JP)

(72) Inventors: Takuto Watanabe, Kitaibaraki (JP); Katsuyuki Tsuchida, Kitaibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 0 days.

(21) Appl. No.: 16/764,472

(22) PCT Filed: Oct. 25, 2018

(86) PCT No.: PCT/JP2018/039741
§ 371 (c)(1),
(2) Date: May 15, 2020

(87) PCT Pub. No.: WO2019/097979
PCT Pub. Date: May 23, 2019

(65) Prior Publication Data
US 2020/0357758 A1    Nov. 12, 2020

(30) Foreign Application Priority Data

Nov. 16, 2017 (JP) .............................. JP2017-221166
Sep. 5, 2018   (JP) .............................. JP2018-166131

(51) Int. Cl.
*H01L 23/00* (2006.01)
(52) U.S. Cl.
CPC .............. *H01L 24/05* (2013.01); *H01L 24/03* (2013.01); *H01L 2224/0218* (2013.01);
(Continued)

(58) Field of Classification Search
CPC . H01L 2224/05644; H01L 2224/05655; H01L 2224/05664
See application file for complete search history.

(56) References Cited

U.S. PATENT DOCUMENTS 9,527,167 B2    12/2016 Ohnishi et al.
11,114,399 B2 *  9/2021 Watanabe ............... C23C 18/36
(Continued)

FOREIGN PATENT DOCUMENTS

EP    2740818 A1    6/2014
EP    3165947 A1    5/2017
(Continued)

OTHER PUBLICATIONS

International Search Report issued in corresponding International Application No. PCT/JP2018/039741 with English translation dated Dec. 4, 2018 (3 pages).
(Continued)

*Primary Examiner* — Dale E Page
*Assistant Examiner* — Wilner Jean Baptiste
(74) *Attorney, Agent, or Firm* — Flynn Thiel, P.C.

(57) ABSTRACT

A semiconductor substrate has, on an Au electrode pad, an electrolessly-plated Ni film/an electrolessly-plated Pd film/ an electrolessly-plated Au film or an electrolessly-plated Ni film/an electrolessly-plated Au film and a method of manufacturing the semiconductor substrate by the steps indicated in (1) to (6) below: (1) a degreasing step; (2) an etching step; (3) a pre-dipping step; (4) a Pd catalyst application step; (5) an electroless Ni plating step; (6) an electroless Pd plating step and electroless Au plating step or an electroless Au plating step.

12 Claims, 1 Drawing Sheet

(52) U.S. Cl.
CPC .............. *H01L 2224/03464* (2013.01); *H01L 2224/0401* (2013.01); *H01L 2224/05073* (2013.01); *H01L 2224/05144* (2013.01); *H01L 2224/05573* (2013.01); *H01L 2224/05644* (2013.01); *H01L 2224/05655* (2013.01); *H01L 2224/05664* (2013.01)

(56) References Cited

U.S. PATENT DOCUMENTS

| | | | | |
|---|---|---|---|---|
| 2003/0022479 A1* | 1/2003 | Hayashida | ........... | H05K 3/3463 438/614 |
| 2007/0031697 A1* | 2/2007 | Test | .................. | B32B 15/20 428/675 |

FOREIGN PATENT DOCUMENTS

| | | | |
|---|---|---|---|
| JP | 2007177268 A | | 7/2007 |
| JP | 2011003858 A | | 1/2011 |
| JP | 2013194291 A | | 9/2013 |
| TW | 201343311 A | | 11/2013 |

OTHER PUBLICATIONS

Written Opinion of International Searching Authority issued in corresponding International Application No. PCT/JP2018/039741, dated Dec. 4, 2018 (4 pages).

Taiwanese Office Action in corresponding Taiwan Application No. 10820481650 dated May 22, 2019 (3 pages).

Du Yuxin et al., Fabrication of Ni Microbumps With Small Feature Size on Au Using Electroless Ni Plating With Noncontact Induction, IEEE Transactions on Components, Packaging and Manufacturing Technology, vol. 5, No. 8, Aug. 2015 (Aug. 1, 2015), pp. 1169-1177, (9 pages).

Office Action of European Patent Office issued in corresponding European Patent Application No. 18 879 890.4 dated Jul. 14, 2021 (9 pages).

* cited by examiner

SEMICONDUCTOR SUBSTRATE AND MANUFACTURING METHOD THEREFOR

TECHNICAL FIELD

The present invention relates to a semiconductor substrate and a method of manufacturing the same.

The present application claims the benefit of priority to Japanese Patent Application No. 2017-221166 filed on 16 Nov. 2017 and Japanese Patent Application No. 2018-166131 filed on 5 Sep. 2018, the contents of which are incorporated herein by reference in their entirety.

BACKGROUND ART

With recent developments for light, thin, short, and small semiconductor devices, the manner for bonding ICs (Integrated Circuits) with substrates or bonding ICs have been changed from conventional wire bonding to flip chip methods.

In order to bond an IC with a substrate or to bond ICs by flip chip methods, a UBM (Under Bump Metallurgy) is formed by deposition or plating on an electrode pad of Al, Cu, Au, or the like that has been formed on an IC, then a lead-free solder of Sn—Ag, Sn—Ag—Cu, or the like is formed thereon by printing, ball mounting, or plating. The product is then bonded with an IC formed in a similar manner or a substrate by heating. Such a method has been used.

Electroless Ni plating has been recently attracting attention as a method of forming an UBM on an electrode pad of Al, Cu, Au, or the like for improving productivity and saving cost.

As a method of forming an electrolessly-plated Ni film on an Al electrode pad, a zincate method based on Zn displacement plating have been widely used, whereas, as a method of forming an electrolessly-plated Ni film on a Cu electrode pad, a Pd catalytic method have been widely used.

However, in compound semiconductor substrates typically including GaAs substrates, Au electrode pads are sometimes used. Au is a chemically stable metal and it has thus been difficult to form electrolessly-plated Ni films by existing zincate methods or Pd catalytic methods. For example, when forming an electrolessly-plated Ni film on a Cu electrode pad, Pd deposits on Cu even by Pd treatment at room temperature, resulting in formation of an Ni film by electroless Ni plating. In contrast, Pd hardly deposits on Au by Pd treatment at room temperature and parts on which an Ni film is not formed by electroless Ni plating occur. Therefore, electroplating has exclusively been used for plating of Ni as UBM on Au electrode pads.

Electroplating has some problems of increased cost and low productivity because electroplating requires photoprocessing for selective plating, wirings are required for applying electric current on each Au electrode pad to be plated, and treatment is required for each pad.

A method of forming an electrolessly-plated Ni film on Au disclosed in PTL 1 is a method in which Au is brought into contact with a specific surface activation liquid, followed by application of a catalyst for electroless plating, and performing electroless Ni plating.

CITATION LIST

Patent Literature

[PTL 1] Japanese Patent Application Publication No. 2007-177268

DISCLOSURE OF INVENTION

Technical Problem

An object of embodiments of the present invention is to provide a semiconductor substrate having an Au electrode pad capable of achieving excellent productivity, and a method of manufacturing the same.

Solution to Problem

The inventors of the present invention found that, as a result of exhaustive study, Ni is stably deposited on an Au electrode pad by electroless Ni plating and thus it is possible to produce a semiconductor substrate which has an electrolessly-plated Ni film/an electrolessly-plated Pd film/an electrolessly-plated Au film or an electrolessly-plated Ni film/an electrolessly-plated Au film electrolessly-plated Au film and which can be used as an UBM, thereby achieving the present invention.

Thus, embodiments of the present invention pertain to the following configurations:

[1] a semiconductor substrate having an Au electrode pad and an electrolessly-plated Ni film/an electrolessly-plated Pd film/an electrolessly-plated Au film or an electrolessly-plated Ni film/an electrolessly-plated Au film on the Au electrode pad;

[2] the semiconductor substrate according to [1], wherein in the electrolessly-plated Ni film/the electrolessly-plated Pd film/the electrolessly-plated Au film and the electrolessly-plated Ni film/the electrolessly-plated Au film, the electrolessly-plated Ni film has a film thickness of 1.5 μm to 10 μm, the electrolessly-plated Au film has a film thickness of 0.01 μm to 0.50 μm, and in the electrolessly-plated Ni film/the electrolessly-plated Pd film/the electrolessly-plated Au film, the electrolessly-plated Pd film has a film thickness of 0.02 μm to 0.50 μm;

[3] the semiconductor substrate according to [1] or [2], wherein the electrolessly-plated Ni film contains 2% by mass to 15% by mass of P;

[4] the semiconductor substrate according to any one of [1] to [3], wherein the semiconductor substrate has a passivation film, the passivation film is formed on the Au electrode pad and has an opening for exposing the Au electrode pad, the Au electrode pad has, at the opening, the electrolessly-plated Ni film/the electrolessly-plated Pd film/the electrolessly-plated Au film or the electrolessly-plated Ni film/the electrolessly-plated Au film formed thereon, and the Au electrode pad is etched by 1 nm or more in a region on which the electrolessly-plated Ni film is formed;

[5] the semiconductor substrate according to any one of [1] to [4], wherein the semiconductor substrate is a compound semiconductor substrate or an oxide semiconductor substrate;

[6] the semiconductor substrate according to [5], wherein the compound semiconductor of the compound semiconductor substrate is any one selected from a II-VI semiconductor, a III-V semiconductor, a III-V (nitride) semiconductor, a IV-VI semiconductor, a IV-IV semiconductor, a I-III-VI semiconductor, and a II-IV-V semiconductor;

[7] a method of manufacturing the semiconductor substrate according to any one of [1] to [6], including forming the electrolessly-plated Ni film/the electrolessly-plated Pd film/the electrolessly-plated Au film or the electrolessly-plated Ni film/the electrolessly-plated Au film on the Au electrode pad by the steps indicated in (1) to (6) below:
(1) a degreasing step
(2) an etching step
(3) a pre-dipping step
(4) a Pd catalyst application step
(5) an electroless Ni plating step
(6) an electroless Pd plating step and electroless Au plating step or
an electroless Au plating step;

[8] the method of manufacturing the semiconductor substrate according to [7], wherein a treatment liquid is used in the Pd catalyst application step and a temperature of the treatment liquid during Pd catalyst application is 20° C. to 90° C.; and

[9] the method of manufacturing the semiconductor substrate according to [7] or [8], wherein in the etching step, Au on the Au electrode pad is etched by a depth of 1 nm or more.

Advantageous Effects of Invention

According to embodiments of the present invention, a semiconductor substrate having an Au electrode pad with excellent productivity and a method of manufacturing the same can be provided.

DESCRIPTION OF EMBODIMENTS

Figure 1A:
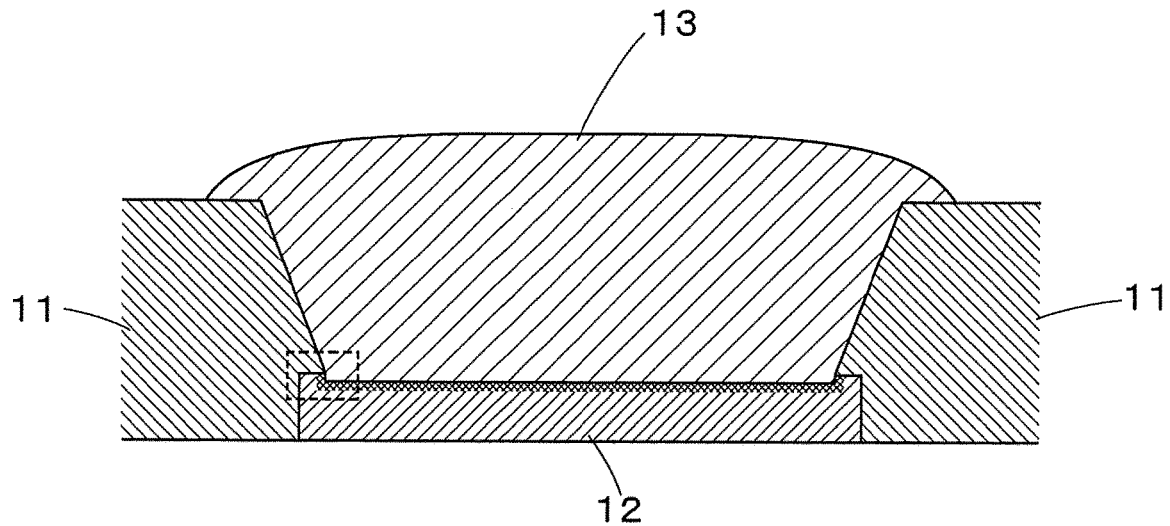
FIG. 1A is a schematic view of a cross-sectional STEM image of a semiconductor substrate after electroless Ni plating on an Au electrode pad.

The semiconductor substrate of the present invention has an Au electrode pad and an electrolessly-plated Ni film/an electrolessly-plated Pd film/an electrolessly-plated Au film or an electrolessly-plated Ni film/an electrolessly-plated Au film on the Au electrode pad.

In the present invention, the symbol "/" means a structure of a plurality of plating films formed by corresponding plating treatment steps, and the order of plating films described corresponds to the order of plating from the electrode pad.

The semiconductor substrate of the present invention may be produced by forming an electrolessly-plated Ni film/an electrolessly-plated Pd film/an electrolessly-plated Au film or an electrolessly-plated Ni film/an electrolessly-plated Au film on an Au electrode pad by steps (1) to (6) indicated below:
(1) a degreasing step
(2) an etching step
(3) a pre-dipping step
(4) a Pd catalyst application step
(5) an electroless Ni plating step
(6) an electroless Pd plating step and an electroless Au plating step or
an electroless Au plating step.

The semiconductor substrate in the present invention has an Au electrode pad and examples thereof include compound semiconductor substrates and oxide semiconductor substrates. In the semiconductor substrate, it is enough that at least a surface is composed of a semiconductor. The semiconductor substrate includes, for example, those having an epitaxial film formed on a heterogeneous substrate.

Examples of the heterogeneous substrate include sapphire substrates, spinel substrates, perovskite yttrium aluminate (YAP) substrates, SiC substrates, Si substrates, and the like.

Examples of a compound semiconductor of the compound semiconductor substrate include II-VI semiconductors, III-V semiconductors, III-V (nitride) semiconductors, IV-VI semiconductors, IV-IV semiconductors, semiconductors, II-IV-V semiconductors and the like.

Examples of II-VI semiconductors include CdTe, CdZnTe, ZnTe, ZnO (which may be categorized as an oxide semiconductor), ZnS, ZnSe, CdS, HgCdTe, and the like.

Examples of III-V semiconductors include GaAs, GaP, AlAs, AlSb, InSb, InAs, GaAsP, InGaAs, InGaP, GaInAsP, AlGaP, AlGaAs, InP, InAlAs, AlGaInP, and the like.

Examples of III-V (nitride) semiconductors include GaN, GaInN, AlGaN, AlGaInN, AlN, and the like.

Examples of IV-VI semiconductors include SnTe, PbTe, and the like.

Examples of IV-IV semiconductors include SiC, SiGe, and the like.

Examples of semiconductors include $CuGaS_2$, $CuInS_2$, $CuGa_xIn_{1-x}Se_2$, and the like.

Examples of II-IV-V semiconductors include $ZnSiP_2$, $ZnSnAs_2$, and the like.

Examples of an oxide semiconductor of the oxide semiconductor substrate include ZnO, $Ga_2O_3$, $Cu_2O$, and the like.

The semiconductor substrate of the present invention has an Au electrode pad. Au is a chemically stable metal and it has thus been difficult to form electrolessly-plated Ni films by existing zincate methods or Pd catalytic methods. Since Pd hardly deposits on Au by Pd catalyst application at room temperature and parts on which an Ni film is not formed by electroless Ni plating occur, stable operation may be disturbed. Therefore, electroplating has exclusively been used for plating Ni as UBM on Au electrode pads.

PTL 1 mentioned above discloses use of a specific surface activation liquid for formation of an electrolessly-plated Ni film on Au. The surface activation liquid disclosed in PTL 1 is an aqueous solution containing (i) a complexing agent, (ii) at least one component selected from the group consisting of copper salts and silver salts, and (iii) an aldehyde, and allows adsorption of the copper salt or silver salt on the Au surface, so as to promote the subsequent application of the Pd catalyst. PTL 1 indicates that the Pd catalyst can be applied onto Au under the presence of the copper salt or silver salt and as a result, Ni plating is feasible. However, stability of the copper salt or silver salt in the activation liquid and adsorption of the copper salt or silver salt on the Au surface are incompatible properties, and it is thus difficult to simultaneously achieve both properties and is also difficult to control of these properties.

In the method of manufacturing the semiconductor substrate of the present invention, an Au electrode pad is subjected to degreasing and etching, followed by pre-dipping, and a catalyst (Pd catalyst) is then applied thereonto and an Ni film is then formed by electroless Ni plating. Namely, in the present invention, the Au surface is slightly etched to increase reactivity of the Au surface, activate the Au surface, thereby promoting application of the Pd catalyst. Therefore, a Pd catalyst can be applied without making a copper salt or silver salt adsorbed onto the surface of an Au electrode pad. Moreover, an electrolessly-plated Ni film can be formed on an Au electrode pad without complex control of conditions for making the copper salt or silver salt adsorbed as in the case of using the surface activation liquid disclosed in PTL 1. Further, since electroless plating can be employed rather than electroplating, the present invention can provide a method of manufacturing a semiconductor substrate with saved cost and excellent productivity.

Due to etching and pre-dipping, a Pd film can be formed on an Au electrode pad and an electrolessly-plated Ni film can then be formed.

The Au electrode pad may be one formed according to known methods and the pad preferably has a thickness of 0.05 µm to 10 µm.

In the degreasing step, the pre-dipping step, the Pd catalyst application step, the electroless Ni plating step, the electroless Pd plating step, and the electroless Au plating step, commercially available treatment liquids similar to those used for electroless Ni plating on Al electrode pads and Cu electrode pads may be used. The treatments may be performed under the conditions recommended by the manufacturers thereof except for Pd catalyst application.

(Degreasing Step)

In order to clean the surface of the Au electrode pad of the semiconductor substrate, degreasing is first performed. Agents which may be used for the degreasing step may be selected among known reagents according to the type of dirt adhered on the semiconductor substrate or the chemical resistance of the semiconductor substrate. For example, alkaline degreasing agent can be mentioned. Examples the agents which may be used include known alkaline degreasing agents such as WBD 200 and WBD 400 (manufactured by JX Nippon Mining & Metals Corporation) may be used.

(Etching Step)

For etching, a cyanogen-based aqueous solution or an iodine aqueous solution that can etch Au may be used. In the etching step, it is preferable to etch Au on the Au electrode pad by a depth of 1 nm or more and more preferably 1 nm or more and 50 nm or less in order to activate the Au surface. When the etched depth is 1 nm or more, sufficient surface activation is obtained. Although the effect may be obtained with the etching depth of 50 nm or more, the effect will be saturated even if the Au surface is further etched. It should be noted that it is required to control the concentration and the time in order to prevent excess etching and thus elimination of the Au electrode pad. For example, when a cyanogen-based aqueous solution is used, KCN=5 g/L may be used and the treatment may be performed for approximately 30 seconds.

The etched depth may be determined by STEM analysis of the cross-section.

Figure 1B:
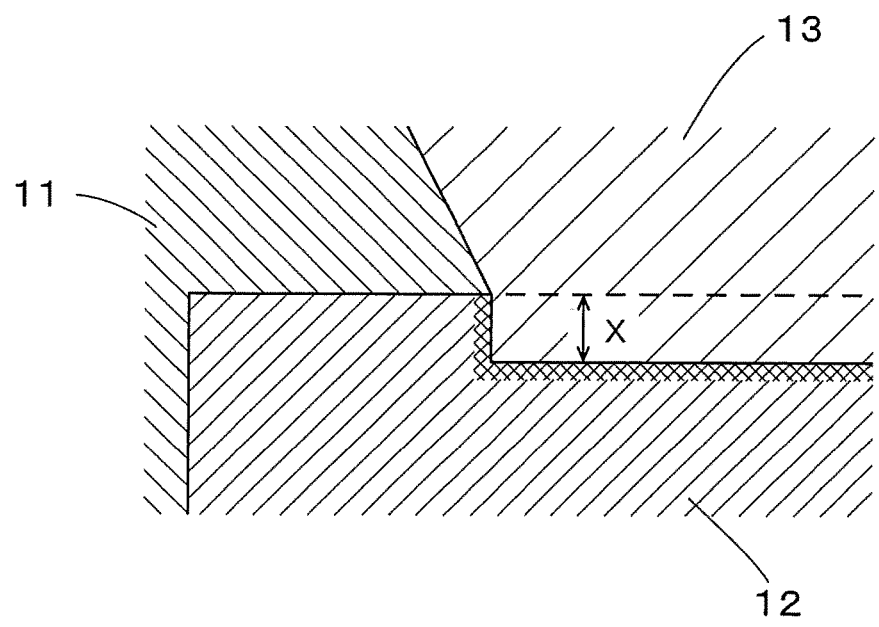
FIG. 1B is a partially enlarged view of FIG. 1A illustrating the etching depth.

FIG. 1A shows a schematic view of a cross-sectional STEM image of a semiconductor substrate after electroless Ni plating on an Au electrode pad. FIG. 1B is a partially enlarged view of the section surrounded by a dashed line in FIG. 1A and shows the etching depth.

When the semiconductor substrate has a passivation film (PV film) 11 having an opening for exposing the Au electrode pad 12, the passivation film 11 is formed on an unexposed edge of the Au electrode pad 12. The section where the passivation film 11 is formed (where the Au electrode pad is not exposed) is not etched even after etching treatment. Therefore, by observing the cross-section of the semiconductor substrate and measuring how much the Au electrode pad 12 is engraved in the section where the passivation film 11 is not formed relative to the section where the passivation film is formed, the amount x of etched Au can be determined. As Au is not etched during electroless Ni plating, the amount of etched Au does not change before and after Ni plating. Therefore, even after formation of an electrolessly-plated Ni film 13 on the Au electrode pad 12 by electroless Ni plating, the amount x of etched Au (etched depth) can be measured by analyzing the cross-section of the semiconductor substrate by STEM and comparing the heights of the Au electrode pad surface in the section where the passivation film 11 is formed and the section where the passivation film is not formed.

The amount of etched Au may alternatively be measured after formation of an electrolessly-plated Au film.

The materials that form the passivation film may be those generally used and include silicon nitride, silicon oxide, polyimide, and the like. The passivation film may have a film thickness of approximately 1 µm or less in the case of silicon nitride or silicon oxide and approximately 0.5 µm to 15 µm in the case of polyimide.

Formation of the passivation film and formation of an opening in the passivation film to expose the Au electrode pad may be performed according to known methods under known conditions.

(Pre-Dipping Step)

Pre-dipping is, prior to Pd catalyst application, to immerse the semiconductor substrate in an aqueous solution having approximately the same acid concentration as the catalyst application liquid. The role of the pre-dipping is to increase hydrophilicity so as to improve adhesiveness to Pd ions included in the catalyst application liquid and to allow reuse of the catalyst application liquid by avoiding mixing of washing water into the catalyst application liquid. The pre-dipping liquid is an aqueous solution of hydrochloric acid or sulfuric acid which may be selected according to the acid in the Pd catalyst application liquid. Pre-dipping may be performed by immersion at room temperature for several tens of seconds to a few minutes, and washing with water is not performed after pre-dipping.

(Pd Catalyst Application Step)

A Pd catalyst may be applied onto the Au electrode pad by performing etching and pre-dipping as a method of forming a Pd film using the treatment liquid for Pd catalyst application.

With regard to Pd catalyst application in the method of manufacturing the semiconductor substrate of the present invention, the treatment temperature is preferably 20° C. to 90° C. in view of stable formation of a plating film on the Au electrode pad.

Commercially available treatment liquid for Pd catalyst application may be used as the treatment liquid for Pd catalyst application. However, the treatment liquid is preferably one stable at a temperature to be used (20° C. to 90° C.) and preferably one containing a Pd salt as a Pd source, hydrochloric acid or sulfuric acid, a complexing agent, or the like.

The Pd salt which may be used is palladium chloride, palladium sulphate, palladium acetate, and the like. The concentration of the Pd salt is preferably, as metallic Pd in the treatment liquid, 5 ppm to 200 ppm and more preferably 20 ppm to 100 ppm.

Hydrochloric acid or sulfuric acid is preferably added as concentrated hydrochloric acid or concentrated sulfuric acid at 50 ml/L to 150 ml/L.

The complexing agent that may be used is ammonium chloride, ammonium sulphate, or the like, which is preferably contained at 1 g/L to 10 g/L.

The temperature of the treatment liquid during Pd catalyst application is preferably 20° C. to 90° C. and the treatment time is preferably 30 seconds or longer in order to stably deposit Pd. When the treatment temperature is 20° C. or higher, the electroless Ni plating to be formed thereon may be stably deposited. Therefore, 20° C. or higher is preferable. Meanwhile, when the treatment temperature is 90° C.

or lower, the treatment liquid is not decomposed. Therefore, it is preferable to perform the treatment at a temperature of the treatment liquid of 20° C. or higher and 90° C. or lower, and, in order to more stably deposit Pd, more preferably in the range of 40° C. to 90° C. and particularly preferably in the range of 60° C. to 80° C. Generally, commercially available treatment liquids for Pd catalyst application used at room temperature may be used and also in this case, the temperature of the treatment liquid is more preferably in the range of 40° C. to 90° C. and particularly preferably in the range of 60° C. to 80° C. as long as the treatment liquids are stable at the temperature used.

When the treatment time is 30 seconds or longer, the electroless Ni plating to be formed thereon may be stably deposited. Therefore, the treatment time of 30 seconds or longer is preferable. In the light of production efficiency, the upper limit of the treatment time is preferably 1800 seconds.

As the treatment method, it is preferable that the Au electrode pad is in contact with the treatment liquid at a temperature of the treatment liquid of 20° C. to 90° C. for 30 seconds or more, it is preferable that, for example, the Au electrode pad is immersed in the treatment liquid, and the electroless plating is preferable in which the treatment liquid is used as an electroless Pd plating liquid.

Within the above conditions, Pd is adhered on the Au electrode pad to such an extent that Pd cannot be detected by observation of the cross-section by STEM. However, an Ni film is then formed by subsequent electroless Ni plating and thus a sufficient effect is obtained.

(Electroless Ni Plating Step)

The method of manufacturing the semiconductor substrate of the present invention includes an electroless Ni plating step after the Pd catalyst application step.

The electroless Ni plating that may be used in the present invention is not particularly limited, and commonly is Ni—P, Ni—P—B or Ni—B plating.

The electroless Ni plating is preferably electroless Ni—P plating or electroless Ni—P—B plating, and more preferably electroless Ni—P plating. The resulting Ni plating film preferably contain P at 15% by mass or less and more preferably 2% by mass to 15% by mass.

When P is 15% by mass or less, Pd plating and Au plating may be easily deposited.

The concentration of P in the Ni plating film and the thickness of each plating film may be determined by elemental analysis based on energy-dispersive X-ray spectrometry (EDX) of the cross-sectional STEM image of a sample.

(Electroless Pd Plating Step and Electroless Au Plating Step, or Electroless Au Plating Step)

The semiconductor substrate of the present invention includes an electrolessly-plated Ni film/an electrolessly-plated Pd film/an electrolessly-plated Au film or an electrolessly-plated Ni film/an electrolessly-plated Au film on the Au electrode pad.

The electrolessly-plated Au film may be formed by two stages, namely electroless displacement Au plating/electroless reduction Au plating.

The plating liquids and plating methods used for the electroless Au plating and the electroless Pd plating may be known plating liquids and plating methods used for formation of UBM of semiconductor substrates.

The electroless Au plating liquid includes a displacement Au plating liquid and a reduction Au plating liquid. Examples of the displacement Au plating liquid include FA-210, FA-500, FA-501, CF-500, CF-500-SS, and the like manufactured by JX Nippon Mining & Metals Corporation. Among others, FA-210 is a displacement Au plating liquid for Ni/Pd/Au, while FA-500, FA-501, CF-500, and CF-500-SS are displacement Au plating liquids for Ni/Au. Examples of the reduction Au plating liquid that may be used include RAP-13 manufactured by JX Nippon Mining & Metals Corporation.

Examples of the electroless Pd plating liquid include CA-400 manufactured by JX Nippon Mining & Metals Corporation, which may be used preferably.

Each plated film may have a film thickness that may vary according to the application or demand characteristics of the semiconductor substrate. The electrolessly-plated Ni film has a film thickness of, in view of prevention of solder diffusion upon solder joining, preferably 1 µm to 15 µm and more preferably 1.5 µm to 10 µm. The electrolessly-plated Au film has a film thickness of, in view of wetting upon solder joining, preferably 0.01 µm or more in the case of Ni/Pd/Au and Ni/Au. The preferable range of the film thickness for both modes is 0.01 µm to 0.50 µm. In the case of configuring Ni/Pd/Au by interposing the electrolessly-plated Pd film in order to prevent Ni diffusion, the electrolessly-plated Pd film is required to have a film thickness of 0.02 µm or more with the preferable range being 0.02 µm to 0.50 µm.

With regard to the Au film thickness, displacement Au plating may limit the film thickness. In a case of Ni/Pd/Au and Ni/Au, film formation mostly ends at 0.03 µm and 0.05 µm, respectively. Therefore, when a greater film thickness is required, the film thickness is increased by performing reduction Au plating.

The film thicknesses of the plating films were measured at a nearly central part of the electrode pad where the surfaces and interfaces of the plating films were parallel to the electrode pad.

The electroless Ni plating formed on the Au electrode pad according to the present invention may be suitably used as an UBM for preventing diffusion of solder bumps into Au electrodes. By using the UBM obtained by the present invention, a semiconductor substrate with saved cost and excellent productivity may be manufactured.

The present invention is not limited to the embodiments and may be demonstrated by modifying the constituents within the range that does not go beyond the scope thereof. Various embodiments of the invention may be formed by appropriately combining more than one constituent disclosed in the embodiments. For example, some constituents may be omitted from all constituents described in the embodiments. Constituents from different embodiments may also be combined appropriately.

EXAMPLES

Specific examples of the present invention are described hereinbelow. The Examples are provided for better understanding of the present invention and advantages thereof, and do not intend to limit the present invention.

[Example 1] to [Example 11], [Comparative Example 1], and [Comparative Example 2]

Electroless plating was performed with a GaAs wafer having the electrode pad and the passivation film indicated below under the processes and conditions indicated in Table 1 to obtain a semiconductor substrate.

GaAs Wafer
  Electrode: Au electrode pad, film thickness 1 µm, pad opening diameter 80 µm, circular Passivation film: SiN, 0.5 μm thick+polyimide, 3 μm thick In Table 1, "O" indicates that the treatment was performed.

Comparative Example 2 was performed by degreasing and etching as pre-treatment of the zincate process, which is used for conventional Al pads, followed by acid immersion, primary zincate treatment, acid immersion and secondary zincate treatment instead of pre-dipping, and Pd catalyst application and further followed by electroless Ni plating. The acid immersion was performed with 30% nitric acid and the primary zincate treatment and the secondary zincate treatment were performed under the conditions indicated in Table 1.

In order to analyze deposition of the resulting electrolessly-plated matter on the Au electrode pad, the external appearance after plating was observed under a microscope and the condition of the plated films were observed by cross-sectional SEM, and the film thicknesses of the plating films were measured. The results are also indicated in Table 1.

The amount of etched Au was determined from cross-sectional STEM analysis after plating. The GaAs wafer having the above Au electrode pad and passivation film was obtained by forming the passivation film on the upper surface of a substrate on which the Au electrode pad had been formed and forming, in the passivation film, an opening (80 μm diameter) for exposing the Au electrode pad, wherein the passivation film was formed on an unexposed edge of the Au electrode pad. At a section of the GaAs wafer where the passivation film had been formed (without the opening), Au was not etched after etching. Therefore, by observing the cross-section of the edge of the Au electrode pad and measuring how much Au was engraved in the section where the passivation film was not formed (where the pad had the opening) relative to the section where the passivation film was formed (without the opening), the amount of etched Au was determined.

The concentration of P in the Ni film was measured by EDX analysis.

The results are also indicated in Table 1.

For those having preferable deposition of plating, solder properties were evaluated. Sn-3% Ag-0.5% Cu solder balls (150 μm diameter) were mounted, solder bumps were formed by reflowing (one and five times) under the conditions indicated below, followed by cross-sectional SEM observation by which the Ni plating film and the intermetallics of Ni and solder were distinguished. Thereby, whether or not the solder was diffused in the Au electrode pad (whether or not Ni served as a barrier layer) was observed.

A solder shear test was performed to evaluate the adhesiveness of plated matter from the breakage interface.

The results of solder properties were the same for the tests with one reflowing process and five reflowing processes.
Reflow heating conditions
Temperature: heating at peak top 265° C.; heated at 260° C. or higher for 40 seconds
Atmosphere: nitrogen atmosphere (oxygen concentration: 600 ppm to 800 ppm)
Solder balls used: Sn-3% Ag-0.5% Cu (150 μm diameter)
Solder shear test conditions
Solder shear rate: 100 μm/sec
Solder shear height: 10 μm from the plating/solder joint surface As indicated in Table 1, electrolessly-plated matter was preferably deposited in Examples 1 to 11, the breakage interfaces in the solder shear tests were all solder, the plated matter/solder interfaces were preferably adhered, and thus the semiconductor substrates were all sufficient to be used as UBM.

TABLE 1

| | | | Treatment | | | | Examples | | | |
|---|---|---|---|---|---|---|---|---|---|---|
| | | Reagents | conditions | 1 | 2 | 3 | 4 | 5 | 6 | 7 |
| Processes | Degreasing | WBD200* | 40° C., 2 min | O | O | O | O | O | O | O |
| | Etching | KCN 5 g/L aqueous solution | 20° C., 30 sec | O | | O | O | O | O | O |
| | | | 20° C., 5 sec | | O | | | | | |
| | Pro-dipping | PD200* | 25° C., 0.5 min | O | O | O | O | O | O | O |
| | Pd catalyst application | W Acti* | 20° C., 2 min | | | | | | | |
| | | | 40° C., 2 min | O | O | | | O | O | O |
| | | | 60° C., 2 min | | | O | | | | |
| | | | 80° C., 2 min | | | | O | | | |
| | Electroless Ni plating | UBN100* (Electroless Mi-P plating liquid) | 80° C., 7.5 min | O | O | O | O | | | O |
| | | | 80° C., 25 min | | | | | O | | |
| | | | 60° C., 50 min | | | | | | O | |
| | Electroless Pd plating | CA400 * | 56° C., 3 min | O | O | O | O | O | O | |
| | | | 56° C., 6 min | | | | | | | O |
| | Electroless displacement Au plating | FA-210* FA-500* | 75° C., 6 min | O | O | O | O | O | O | O |
| | | | 75° C., 6 min | | | | | | | |
| | Electroless reduction Au plating | RAP-13* | 45° C., 3 min | O | O | O | O | O | O | O |
| | Target plating film thickness (Ni/Pd/Au) (μm) | | | 1.5/0.05/0.05 | 1.5/0.05/0.05 | 1.5/0.05/0.05 | 1.5/0.05/0.05 | 5/0.05/0.05 | 10/0.05/0.05 | 1.5/0.1/0.05 |
| Evaluation results | Amount or etched Au (nm) | | | 10 | 1 | 10 | 10 | 10 | 10 | 10 |
| | P concentration | | | 7 | 7 | 7 | 7 | 7 | 7 | 7 |

TABLE 1-continued

| | | | | | | | | |
|---|---|---|---|---|---|---|---|---|
| in Ni film (% by mass) | | | | | | | | |
| Results of observation of plating appearance, cross-section, and film thickness | | Good. Just as targeted film thickness. | Good. Just as targeted film thickness. | Good. Just as targeted film thickness. | Good. Just as targeted film thickness. | Good. Just as targeted film thickness. | Good. Just as targeted film thickness. | Good. Just as targeted film thickness. |
| Evaluation of solder properties | | Good as solder did not diffuse to the Au pad. Breakage at the solder in the solder shear test. | | | | | | |

| | | Reagents | Treatment conditions | Examples 8 | 9 | 10 | 11 | Comparative Examples 1 | 2 |
|---|---|---|---|---|---|---|---|---|---|
| Processes | Degreasing | WBD200* | 40° C., 2 min | ○ | ○ | ○ | ○ | ○ | Degreasing (product name: WBD400*, 50° C., 2 min) |
| | Etching | KCN 5 g/L aqueous solution | 20° C., 30 sec | ○ | ○ | ○ | ○ | | Etching (product name: UAE100*, 50° C., 1 min) 30% nitric acid |
| | Pre-dipping | PD200* | 20° C., 5 sec 25° C., 0.5 min 20° C., 2 min | ○ ○ | ○ | ○ | ○ | ○ | Zincate (product name: WBZ100*, 25° C., 0.5 min) |
| | Pd catalyst application | W Acti* | 40° C., 2 min 60° C., 2 min | | ○ | ○ | ○ | ○ | 30% nitric acid Zincate (product name: WBZ100*, 25° C., 0.5 min) |
| | Electroless Ni plating | UBN100* (Electroless Ni-P plating liquid) | 80° C., 2 min 80° C., 7.5 min 80° C., 25 min 80° C., 50 min | ○ | ○ | ○ | ○ | ○ | ○ |
| | Electroless Pd plating | CA400* | 56° C., 3 min 56° C., 6 min | ○ | ○ | | | ○ | ○ |
| | Electroless displacement Au plating | FA-210* FA-500* | 75° C., 6 min 75° C., 6 min | ○ | ○ | ○ | ○ | ○ | ○ |
| | Electroless reduction Au plating | RAP-13* | 45° C., 3 min | ○ | | | ○ | ○ | ○ |
| | Target plating film thickness (Ni/Pd/Au) (µm) | | | 1.5/0.05/0.05 | 1.5/0.05/0.02 | 1.5/0.00/0.05 | 1.5/0.00/0.05 | 1.5/0.05/0.05 | 1.5/0.05/0.05 |
| Evaluation results | Amount of etched Au (nm) | | | 10 | 10 | 10 | 10 | 0 | 0 |
| | p concentration in Ni film (% by mass) | | | 7 | 7 | 7 | 7 | — | — |
| | Results of observation of plating appearance, cross-section, and film thickness | | | Good. Just as targeted film thickness. | Good. Just as targeted film thickness. | Good. Just as targeted film thickness. | Good. Just as targeted film thickness. | No plating | No plating |
| | Evaluation of solder properties | | | Good as solder did not diffuse to the Au pad. Breakage at the solder in the solder shear test. | | | | — | — |

* Manufactured by JX Nippon Mining s Metals Corporation

[Example 12] to [Example 22], [Comparative Example 3], and [Comparative Example 4]

Semiconductor substrates of Example 12 to Example 22, Comparative Example 3, and Comparative Example 4 were obtained in the same manner as in Example 1 to Example 11, Comparative Example 1, and Comparative Example 2, respectively, except that an SiC wafer which had the electrode pad and the passivation film indicated below was used instead of the GaAs wafer used in Example 1 to Example 11, Comparative Example 1 and Comparative Example 2, and were evaluated in the same manner as in Example 1. As a result, the evaluation results equivalent to those of Example 1 to Example 11, Comparative Example 1, and Comparative Example 2, respectively, were obtained.

SiC Wafer
  Electrode: Au electrode pad, film thickness 1 μm, pad opening 1200 μm×800 μm, rectangular
  Passivation film: SiN, 1.0 μm thick+polyimide, 5 μm thick

[Example 23] to [Example 33], [Comparative Example 5], and [Comparative Example 6]

Semiconductor substrate of Example 23 to Example 33, Comparative Example 5, and Comparative Example 6 were obtained in the same manner as in Example 1 to Example 11, Comparative Example 1, and Comparative Example 2, respectively, except that an epitaxial wafer which had the electrode pad and the passivation film indicated below and had a GaN epitaxial film formed on an Si substrate was used instead of the GaAs wafer used in Example 1 to Example 11, Comparative Example 1, and Comparative Example 2, and were evaluated in the same manner as in Example 1. As a result, the evaluation results equivalent to those of Example 1 to Example 11, Comparative Example 1, and Comparative Example 2, respectively, were obtained.

Epitaxial wafer having a GaN epitaxial film formed on an Si substrate
  Electrode: Au electrode pad, film thickness 1.5 μm, pad opening 900 μm×600 μm, rectangular
  Passivation film: SiN, 1.0 μm thick+polyimide, 5 μm thick

[Example 34] to [Example 44], [Comparative Example 7], and [Comparative Example 8]

Semiconductor substrates of Example 34 to Example 44, Comparative Example 7, and Comparative Example 8 were obtained in the same manner as in Example 1 to Example 11, Comparative Example 1, and Comparative Example 2 except that an epitaxial wafer which had the electrode pad and the passivation film indicated below and had a GaN epitaxial film formed on a sapphire substrate was used instead of the GaAs wafer used in Example 1 to Example 11, Comparative Example 1 and Comparative Example 2, and were evaluated in the same manner as in Example 1. As a result, the evaluation results equivalent to those of Example 1 to Example 11, Comparative Example 1, and Comparative Example 2, respectively, were obtained.

Epitaxial wafer having a GaN epitaxial film formed on a sapphire substrate
  Electrode: Au electrode pad, film thickness 0.5 μm, pad opening 60 μm×60 μm, square
  Passivation film: SiN, 0.5 μm thick

[Example 45] to [Example 55], [Comparative Example 9], and [Comparative Example 10]

Semiconductor substrates of Example 45 to Example 55, Comparative Example 9, and Comparative Example 10 were obtained in the same manner as in Example 1 to Example 11, Comparative Example 1, and Comparative Example 2, respectively, except that a CdTe wafer which had the electrode pad and the passivation film indicated below was used instead of the GaAs wafer used in Example 1 to Example 11, Comparative Example 1, and Comparative Example 2, and were evaluated in the same manner as in Example 1. As a result, the evaluation results equivalent to those of Example 1 to Example 11, Comparative Example 1, and Comparative Example 2, respectively, were obtained.

CdTe Wafer
  Electrode: Au electrode pad, film thickness 0.1 μm, pad opening diameter 150 μm, circular
  Passivation film: positive photoresist, 3 μm thick

REFERENCE SIGNS LIST

11 Passivation film
12 Au electrode pad
13 Electrolessly-plated Ni film
x Amount of etched Au

The invention claimed is:

1. A semiconductor substrate having an Au electrode pad and an electrolessly-plated Ni film/an electrolessly-plated Pd film/an electrolessly-plated Au film or an electrolessly-plated Ni film/an electrolessly-plated Au film on the Au electrode pad, wherein the electrolessly-plated Ni film contains 2% by mass to 15% by mass of P.

2. The semiconductor substrate according to claim 1, wherein in the electrolessly-plated Ni film/the electrolessly-plated Pd film/the electrolessly-plated Au film and the electrolessly-plated Ni film/the electrolessly-plated Au film,
  the electrolessly-plated Ni film has a film thickness of 1.5 μm to 10 μm,
  the electrolessly-plated Au film has a film thickness of 0.01 μm to 0.50 μm, and
  in the electrolessly-plated Ni film/the electrolessly-plated Pd film/the electrolessly-plated Au film,
  the electrolessly-plated Pd film has a film thickness of 0.02 μm to 0.50 μm.

3. The semiconductor substrate according to claim 1, wherein the semiconductor substrate has a passivation film,
  the passivation film is formed on the Au electrode pad and has an opening for exposing the Au electrode pad,
  the Au electrode pad has, at the opening, the electrolessly-plated Ni film/the electrolessly-plated Pd film/the electrolessly-plated Au film or the electrolessly-plated Ni film/the electrolessly-plated Au film formed thereon, and
  the Au electrode pad is etched by 1 nm or more in a region on which the electrolessly-plated Ni film is formed.

4. The semiconductor substrate according to claim 1, wherein the semiconductor substrate is a compound semiconductor substrate or an oxide semiconductor substrate.

5. The semiconductor substrate according to claim 4, wherein the compound semiconductor of the compound semiconductor substrate is any one selected from a II-VI semiconductor, a III-V semiconductor, a III-V (nitride) semiconductor, a IV-VI semiconductor, a IV-IV semiconductor, a semiconductor, and a II-IV-V semiconductor.

6. A method of manufacturing the semiconductor substrate according to claim 1, including forming the electrolessly-plated Ni film/the electrolessly-plated Pd film/the electrolessly-plated Au film or the electrolessly-plated Ni film/the electrolessly-plated Au film on the Au electrode pad by the steps indicated in (1) to (6) below:
  (1) a degreasing step
  (2) an etching step
  (3) a pre-dipping step
  (4) a Pd catalyst application step
  (5) an electroless Ni plating step
  (6) an electroless Pd plating step and electroless Au plating step or
  an electroless Au plating step.

7. The method of manufacturing the semiconductor substrate according to claim 6, wherein a treatment liquid is used in the Pd catalyst application step and a temperature of the treatment liquid during Pd catalyst application is 20° C. to 90° C.

8. The method of manufacturing the semiconductor substrate according to claim 6, wherein in the etching step, Au on the Au electrode pad is etched by a depth of 1 nm or more.

9. A semiconductor substrate having an Au electrode pad and an electrolessly-plated Ni film/an electrolessly-plated Pd film/an electrolessly-plated Au film or an electrolessly-plated Ni film/an electrolessly-plated Au film on the Au electrode pad, wherein
the semiconductor substrate has a passivation film,
the passivation film is formed on the Au electrode pad and has an opening for exposing the Au electrode pad,
the Au electrode pad has, at the opening, the electrolessly-plated Ni film/the electrolessly-plated Pd film/the electrolessly-plated Au film or the electrolessly-plated Ni film/the electrolessly-plated Au film formed thereon, and
the Au electrode pad is etched by 1 nm or more in a region on which the electrolessly-plated Ni film is formed.

10. The semiconductor substrate according to claim 9, wherein in the electrolessly-plated Ni film/the electrolessly-plated Pd film/the electrolessly-plated Au film and the electrolessly-plated Ni film/the electrolessly-plated Au film,
the electrolessly-plated Ni film has a film thickness of 1.5 µm to 10 µm,
the electrolessly-plated Au film has a film thickness of 0.01 µm to 0.50 µm, and
in the electrolessly-plated Ni film/the electrolessly-plated Pd film/the electrolessly-plated Au film,
the electrolessly-plated Pd film has a film thickness of 0.02 µm to 0.50 µm.

11. The semiconductor substrate according to claim 9, wherein the semiconductor substrate is a compound semiconductor substrate or an oxide semiconductor substrate.

12. The semiconductor substrate according to claim 11, wherein the compound semiconductor of the compound semiconductor substrate is any one selected from a II-VI semiconductor, a III-V semiconductor, a III-V (nitride) semiconductor, a IV-VI semiconductor, a IV-IV semiconductor, a semiconductor, and a II-IV-V semiconductor.

* * * * *